United States Patent
Wuidart

(10) Patent No.: US 7,813,216 B2
(45) Date of Patent: Oct. 12, 2010

(54) READING OF THE STATE OF A NON-VOLATILE STORAGE ELEMENT

(75) Inventor: Sylvie Wuidart, Pourrieres (FR)

(73) Assignee: STMicroelectronics S.A., Montrouge (FR)

( * ) Notice: Subject to any disclaimer, the term of this patent is extended or adjusted under 35 U.S.C. 154(b) by 98 days.

(21) Appl. No.: 11/662,995

(22) PCT Filed: Sep. 13, 2005

(86) PCT No.: PCT/FR2005/050738

§ 371 (c)(1), (2), (4) Date: Feb. 25, 2008

(87) PCT Pub. No.: WO2006/031060

PCT Pub. Date: Mar. 23, 2006

(65) Prior Publication Data

US 2008/0253200 A1     Oct. 16, 2008

(30) Foreign Application Priority Data

Sep. 15, 2004     (FR) .................................. 04 52058

(51) Int. Cl.
*G11C 8/18* (2006.01)
(52) U.S. Cl. ............................. 365/233.11; 365/189.07
(58) Field of Classification Search ............ 365/233.11, 365/189.07, 148, 149
See application file for complete search history.

(56) References Cited

U.S. PATENT DOCUMENTS

| 4,953,123 | A | * | 8/1990 | Takeuchi et al. | ............... 365/66 |
| 7,061,825 | B2 | * | 6/2006 | Yada et al. | ............. 365/189.07 |
| 2004/0017718 | A1 | | 1/2004 | Ooishi | |
| 2005/0024950 | A1 | | 2/2005 | Sakimura et al. | |
| 2005/0071114 | A1 | * | 3/2005 | Nehrig | ....................... 702/127 |

FOREIGN PATENT DOCUMENTS

JP     2003257173 A     9/2002

OTHER PUBLICATIONS

Internatioal Search Report from corresponding International Application PCT/FR2005/050738, filed Sep. 13, 2005.

* cited by examiner

*Primary Examiner*—Tuan T Nguyen
*Assistant Examiner*—Toan Le
(74) *Attorney, Agent, or Firm*—Lisa K. Jorgenson; James H. Morris; Wolf, Greenfield & Sacks, P.C.

(57) ABSTRACT

A method for reading of the state of a non-volatile memory element, including conditioning the frequency of a first oscillatory to the state of this element, and comparing the frequency of the first oscillator with the predetermined frequency of a second oscillator, selected between two possible frequency values for the first oscillator, according to the state of the storage element.

36 Claims, 2 Drawing Sheets

READING OF THE STATE OF A NON-VOLATILE STORAGE ELEMENT

FIELD OF THE INVENTION

The present invention generally relates to the reading of the state of a non-volatile storage element and more specifically to the reading of the programmed or unprogrammed state of such an element.

An example of application of the present invention relates to the reading of a bit stored in non-volatile fashion (irreversible or not) in an integrated circuit, for example, to condition the operation of all or part of the circuit. It may be, in particular, to program the end of an integrated circuit test mode to place it, once the element has been programmed, in a state of normal operation.

DISCUSSION OF THE RELATED ART

Many solutions are known to form, in an integrated circuit, a non-volatile programming storage element, that is capable of storing one state or another according to whether it has or not been programmed even when power is removed.

A first family concerns fusible elements formed by an oxide used as a capacitor. When the capacitor is blank (unprogrammed), there is no leakage current through the dielectric. The programming consists of applying across the capacitor a sufficiently high voltage to deteriorate the oxide and then create a path for the current through the capacitor. The state switching due to the programming is irreversible.

A second family concerns fusible elements formed of a conductive track (metallic) which is interrupted (mechanically cut or molten by a laser beam) to irreversibly program the storage element. It may also be resistive elements turned into open circuits by programming.

A third family of non-volatile storage elements is formed of EEPROM or FLASH cells, integrated in the component. The state switching due to the programming is generally reversible.

A fourth family concerns resistive polysilicon elements, the programming of which is performed by causing an irreversible decrease in the value of the resistance by having a current greater than a threshold flow through the element. This threshold corresponds to a current level for which the polysilicon resistor exhibits a maximum value. This technique and its programming methods are described, for example, in international applications WO03/069631 and WO03/069656.

A fifth family of non-volatile storage elements, reversible, is based on the chalcogenide technology. This technology is described, for example, in article "Chalcogenide-Based Non-Volatile Memory Technology" of G. Maimon, E. Spall, R. Quinn, and S. Schnur, published by IEEE in 2001 (0-7803-6599-2/01), and is also known under trade name "OVONYX".

Whatever the storage element used, the reading of the state of this element is performed conventionally by measuring the current in the element or the voltage thereacross to compare the measured value with a current or voltage threshold.

A disadvantage is that it is then necessary to have accurate and stable current and/or voltage references, and the corresponding generation circuits take up space on an integrated circuit.

Another disadvantage is that current and/or voltage measurements are often sensitive to technological and integrated circuit manufacturing dispersions, and undergo drifts along the circuit lifetime.

Another disadvantage of non-volatile (reversible or not) storage element read systems is that the measurement of the current or of the voltage (more specifically its comparison with a threshold) requires a synchronization with respect to a triggering signal, and thus a synchronous operation. This results in a risk of modification of the comparison result after modification of the clock synchronizing the measurement. Such a disadvantage is particularly disturbing in so-called security applications, for example, when the content in the storage element conditions aspects of access authorization to certain functions of the component or the data encryption (key).

SUMMARY OF THE INVENTION

The present invention aims at enabling reading of the state of a non-volatile storage element by overcoming the disadvantages of known read systems.

The present invention especially aims at providing an economical solution, especially in terms of integration surface area in a circuit, to read a bit.

The present invention also aims at providing a solution insensitive to technological or integrated circuit manufacturing dispersions.

The present invention also aims at providing a solution which can easily adapt from one technology to another.

In an application of the present invention where the storage element(s) store states critical as to the integrated circuit security, the present invention also aims at providing a solution in which the state stored by the circuit is undetectable otherwise than by reading thereof.

To achieve these and other objects, the present invention provides a method for reading the state of a non-volatile storage element, consisting of:

conditioning the frequency of a first oscillator to the state of this element; and comparing the frequency of the first oscillator with the predetermined frequency of a second oscillator, selected to be included between two possible frequency values of the first oscillator according to the state of the storage element.

According to an embodiment of the present invention, the frequency of the first oscillator is compared with that of a third oscillator having a frequency smaller than that of the first oscillator in programming states of the storage element, and smaller than that of the second oscillator.

According to an embodiment of the present invention, the first oscillator triggers the reading of the state of the second one.

According to an embodiment of the present invention, the storage element is a resistive and capacitive circuit.

According to an embodiment of the present invention, the storage element comprises a resistor programmable by irreversible decrease in its value.

According to an embodiment of the present invention, the respective frequencies of the oscillators are conditioned by elements of same nature.

The present invention also provides a circuit for reading the state of a non-volatile storage element comprising:

a first oscillator having its frequency conditioned by the state of the storage element;

at least one second oscillator having a predetermined frequency which is selected between the frequencies of the first oscillator in two states of the storage element; and a comparator of the respective frequencies of the first and second oscillators.

According to an embodiment of the present invention, the circuit comprises a third oscillator having a predetermined frequency which is selected to be smaller than the frequency of the first oscillator whatever the programming state of the storage element, and smaller than that of the second oscillator.

According to an embodiment of the present invention, the comparator comprises:

one counter per oscillator, the respective clock inputs of the counters receiving the signals provided by the corresponding oscillators; and a logic circuit for analyzing counter overflow signals.

BRIEF DESCRIPTION OF THE DRAWINGS

The foregoing objects, features, and advantages of the present invention will be discussed in detail in the following non-limiting description of specific embodiments in connection with the accompanying drawings, in which:

FIG. 2 shows a detailed embodiment of the circuit of FIG. 1; and

DETAILED DESCRIPTION

Figure 1:
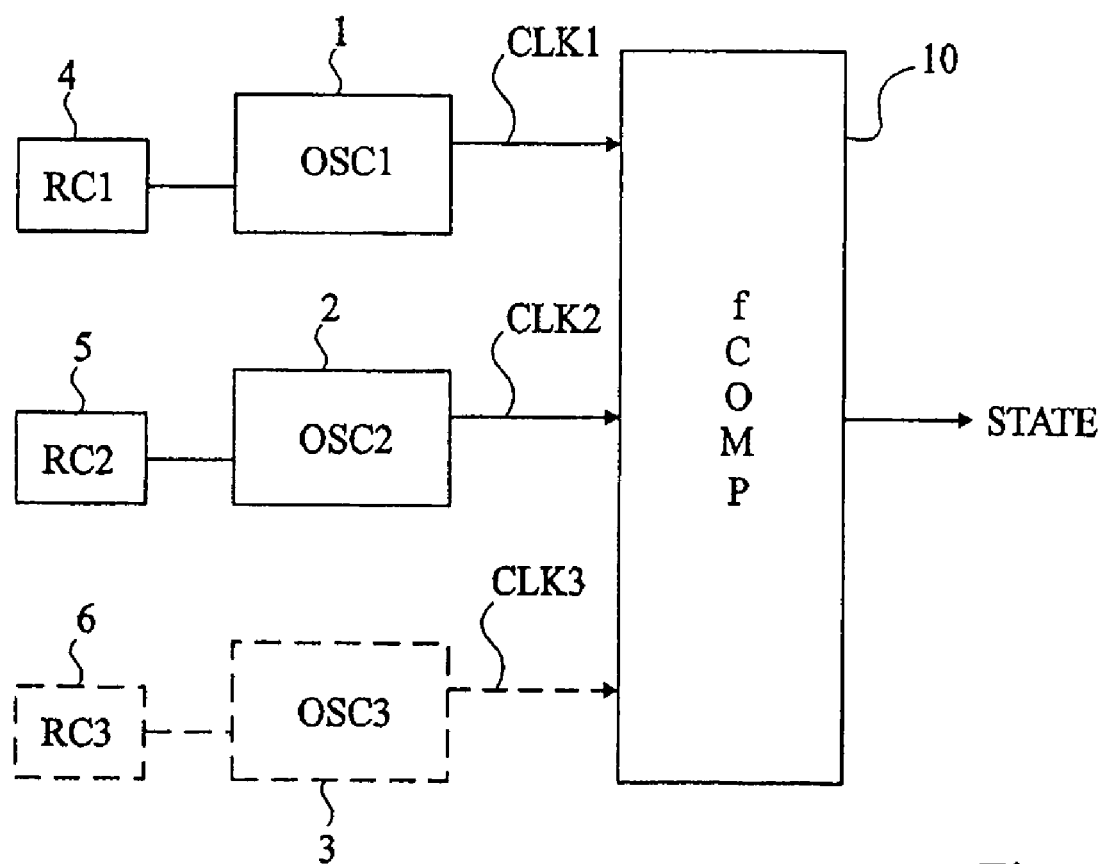
FIG. 1 very schematically shows in the form of blocks an embodiment of a circuit for reading the state of a non-volatile storage element according to the present invention.

The same elements have been designated with the same reference numerals in the different drawings. For clarity, only those elements that are useful to the understanding of the present invention have been shown and will be described hereafter. In particular, the destination of the binary state read by a circuit according to the present invention has not been described in detail, the present invention being compatible with all conventional applications exploiting one or several bits stored in one or several elements in non-volatile fashion.

The present invention will be described hereafter in relation with the storage of a bit, but it more generally applies to the storage of several bits by duplicating the read circuit.

A feature of the present invention is to use the state of a non-volatile storage element to be read from to condition the frequency of a first oscillator. Preferably, the non-volatile storage element conditions the value of a resistive and capacitive cell of a ring oscillator.

According to the present invention, the frequency of the first oscillator conditioned by the state of the element to be read from is compared with that of at least one second oscillator. The frequency of the second oscillator is predetermined and is selected between the two possible frequency values of the first oscillator according to the state, programmed or not, of the storage element.

FIG. 1 very schematically shows in the form of blocks an embodiment of a circuit for reading the state of a non-volatile memory element according to the present invention. The circuit comprises a first oscillator 1 (OSC1) providing a clock signal CLK1 to an element 10 (fCOMP) for analyzing the frequency of circuit 1. The frequency of clock signal CLK1 is conditioned by the value of a resistive and capacitive circuit 4 (RC1). The time constant of circuit 4 is a function of the state of a non-volatile storage element that it comprises, so that the frequency of signal CLK1 is conditioned by this storage element.

According to the present invention, circuit 10 receives at least one second clock signal CLK2 provided by a second oscillator 2 (OSC2). The frequency of oscillator 2 however is, conversely to that of the first one, predetermined. Preferably, the frequency of signal CLK2 is conditioned by the value of a resistive and capacitive circuit 5 (RC2).

In a simplified version of the present invention, circuit 10 compares the respective frequencies of signals CLK1 and CLK2 to determine a state STATE, provided by circuit 10, and which represents the programming state of the storage element contained in circuit 4.

According to a preferred embodiment, illustrated in dotted lines in FIG. 1, a third oscillator 3 (OSC3) provides an additional clock signal CLK3 to circuit 10. The frequency of oscillator 3 is, preferably, conditioned by a third resistive and capacitive circuit 6 (RC3). The frequency of signal CLK3 is predetermined and is selected to be smaller than the frequency of signal CLK2 and smaller than the frequency of signal CLK1, whatever the programming state of the element of circuit 4.

The reading of the state of a storage element by comparing the frequency of a clock signal that it conditions with one or several predetermined frequencies has many advantages.

First, it is not necessary to generate voltage and current reference signals to obtain the result. Indeed, by using clock signals, the comparison may be performed directly digitally by circuit 10, as will better appear from the discussion of the following drawings.

Another advantage is a space gain of the frequency analysis circuit with respect to voltage and current comparisons. Indeed, simple flip-flops and logic gates are sufficient to detect programming state STATE of the storage element.

Another advantage is, according to the preferred embodiment in which resistive and capacitive cells of same nature are used, that a self-adaptation of the read circuit according to the possible technological and manufacturing dispersions is obtained. This self-adaptation is also valid in case of a circuit operation drift.

Another advantage, more specifically useful for so-called security applications, is that elements of flip-flop and logic gate type are often present in a large number in an integrated circuit, so that the elements constitutive of circuit 10 may be "embedded" in a great number of similar elements, which makes them more uneasily detectable.

FIG. 2 shows a more detailed electric diagram of a circuit for reading the state of a non-volatile storage element. In the example of FIG. 2, the different oscillators are formed of ring oscillators each comprising, for example, three inverters in series, the output of the last inverter being looped back onto the input of the first one. Thus, oscillator 1 is formed of three inverters 11, 12, and 13 in series. The output of oscillator 13 is looped back onto the input of inverter 11 and defines the output of the oscillator providing signal CLK1. The oscillation frequency is conditioned by resistive and capacitive circuit 4, formed of a capacitor 41 in series with a resistor 42 between the input of inverter 13 and ground M.

Oscillator 2 (respectively oscillator 3 if present) is, similarly, formed of inverters 21, 22, and 23 (respectively, 31, 32, and 33) in series, the output of inverter 23 (respectively 33) being connected to the input of inverter 21 (respectively, 31) and clock signal CLK2 (respectively, CLK3) being sampled from the output of inverter 23 (respectively, 33). The oscillating frequency of oscillator 2 (respectively, 3) is conditioned by the time constant of circuit 5 (respectively 6), formed of a capacitor 51 in series with a resistor 61 between the input of inverter 23 and the ground (respectively of a capacitor 61 in series with a resistor 62 between the input of inverter 33 and the ground).

Other conventional ring oscillator structures are possible, in particular with different numbers of inverters. However, to minimize the bulk of the oscillators, the embodiment of FIG. 2 is a preferred embodiment.

In FIG. 2, circuit 10 comprises three digital counters 14 (CNT1), 15 (CNT2), and 16 (CNT3) having their respective clock inputs receiving signals CLK1, CLK2, and CLK3. The present invention exploits overflow signals (END OF COUNT) EOC1, EOC2, and EOC3 of counters 14, 15, and 16. Functionally, the time of occurrence of the end-of-count or overflow signal depends on the frequency of the clock signal of the corresponding counter. Circuit 10 also comprises logic elements for decoding overflow signals.

In the example of FIG. 2, a first flip-flop 17 receives, on its data input D, signal EOC2. A second flip-flop 18 receives, on its data input D, signal EOC3. Flip-flops 17 and 18 receive signal EOC1 on their respective clock inputs. Non-inverted input Q of flip-flop 17 is combined with inverted output NQ of flip-flop 18 by a logic AND-type gate 19 which provides state STATE for programming resistive and capacitive element 4. As will be seen hereafter, this programming may be performed either at the level of capacitor 41, or at the level of resistor 42.

Functionally, signal EOC1 is used to start the reading of the states present at the input of flip-flops 17 and 18. According to the respective states of signals EOC2 and EOC3 at the time when signal EOC1 switches high, the result provided by circuit 10 differs.

With a circuit such as shown in FIG. 2, oscillators 1, 2, and 3 are active as soon as the circuit is powered on (be it a general powering-on or a specific switching).

The function of counters 14, 15, and 16 is to provide stability when powering-on the circuit. The length (bit number) of the counters is selected according to a compromise between the desired stability and the detection speed. Indeed, the more the counter is over a large number of bits, the more the detection will be delayed with respect to the powering-on, but the more the result will be stable. As an example of implementation, counters of a number of bits ranging between 4 and 32 (preferably, 8) will be appropriate to most applications.

According to a simplified embodiment, the counters are thus omitted and signals CLK1, CLK2, and CLK3 directly drive flip-flops 17 and 18. Such an embodiment is appropriate for sufficiently small frequencies of signals CLK1, CLK2, and CLK3 to avoid oscillation of output signal STATE.

According to another embodiment, a control signal is used to reset the counters and cause a new reading of the storage element.

Figure 3A:
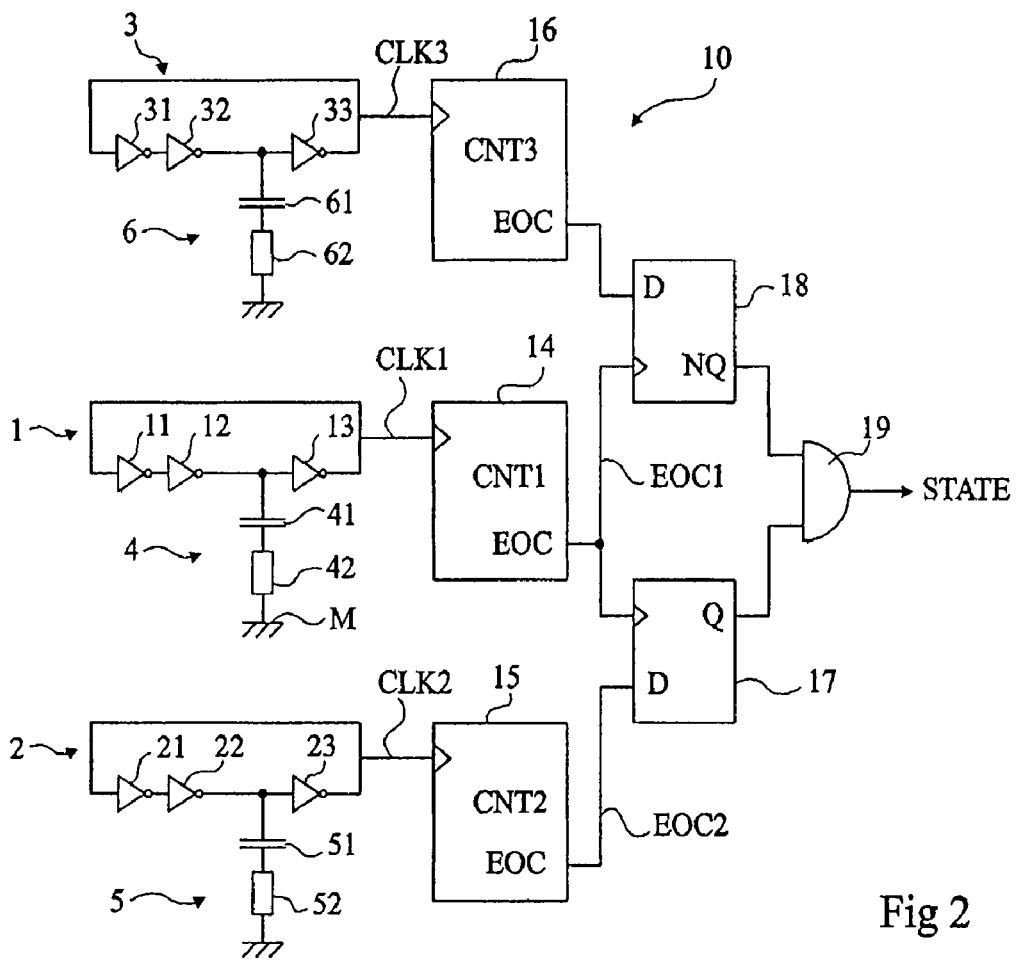
FIGS. 3A and 3B illustrate, in timing diagrams, the operation of the circuit of FIG. 2.
Figure 3B:
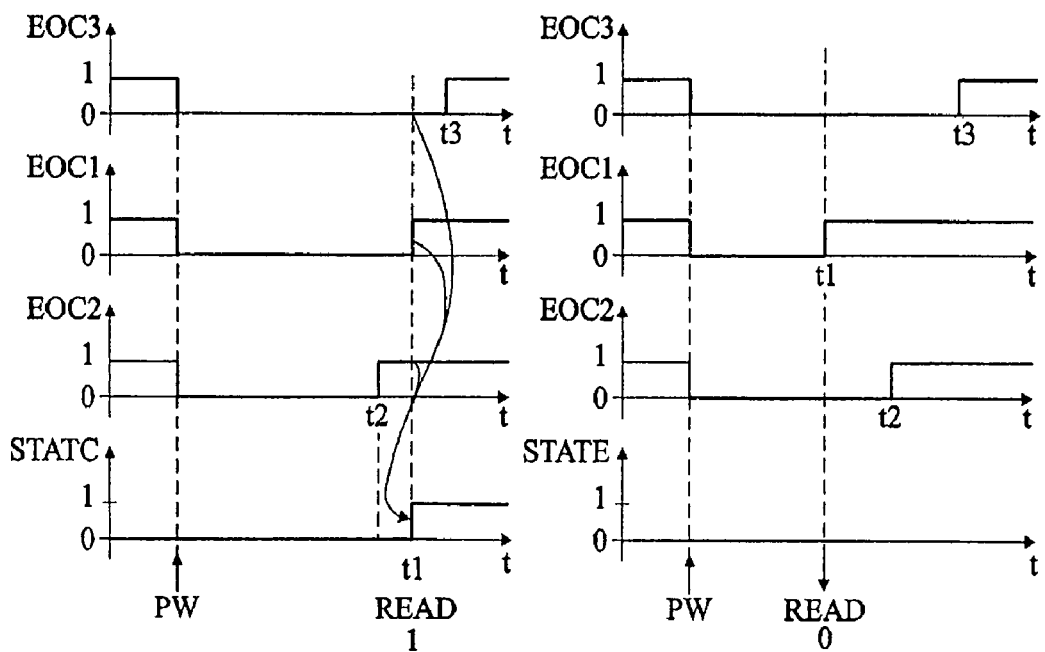

FIG. 3A illustrates the operation of the circuit of FIG. 2 while storage element 4 is in a first state. This state is indifferently noted 0 or 1 but corresponds to that where cell 4 provides a relatively high clock frequency with respect to that provided in the second state. This second state is illustrated in FIG. 3B.

From as soon as the powering-on (PW), all the elements of circuit 10 are supplied. This causes the low switching of signals EOC1, EOC2, and EOC3 (assuming them to be active in the high state). Counters 14, 15, and 16 start to count at the rates of the clock signals provided by the respective oscillators. Preferably, signals EOC provided by the counters correspond to a same number (for example, 256 for a counter over 8 bits). As an alternative, these numbers will be different according to the counters (for example, by providing counters over different numbers of bits), provided for this to be compatible with the differences between the frequencies to be monitored.

In the example of FIG. 3A, the first counter to reach its limit is counter 15, so that signal EOC2 switches high at a time t2. Time t1 is the same in FIG. 3B since the frequency of oscillator 2 is predetermined. Similarly, in the shown embodiment where a third oscillator is used, signal EOC3 switches high at a time t3 whatever the programming state of element 4. Time t3 is subsequent to time t2 due to the selection of the frequencies of oscillators 2 and 3.

In the first case (FIG. 3A), time t1 of switching of signal EOC1 is between times t2 and t3. This results in a high switching of signal STATE at this time t1.

In the case of FIG. 3B where the programming state of element 4 is different, time t1 appears before times t2 and t3 so that the read state is a low state.

The fact of using signal EOC1 as a sampling clock of the two flip-flops provides a read circuit with a synchronous operation which requires no additional triggering signal.

In the simplified embodiment where only two oscillators are used, the reading of the state of the storage element is only performed in sure fashion in a single direction (switching to the high state, FIG. 3A). Thus, the use of the third oscillator enables validating both the reading of a low state and the reading of a high state.

The different conventional techniques for forming a non-volatile storage element may be implemented in the context of the present invention. However, certain techniques will be preferred to bring additional advantages which will be discussed hereafter.

An oxide fuse playing the role of a capacitor (first family) may be used to form capacitor 41. In this case, capacitors 61 and 51 are, preferably, selected to have the same values as non-punctured capacitor 41 and the different values of the oscillation frequency are obtained by resistors of different values.

In the case of a fusible element formed of a conductive line cut on assembly of the circuit or subsequently by a laser beam (second family), resistive element 42 is preferentially formed of at least two resistors, one of which is switchable by the fusible element. Resistors 52 and 62 are preferentially selected to be of same values and the difference between the oscillation frequencies is set by the values of capacitors 41, 51, and 61. As an alternative, a resistive element 42 which is broken (open circuit) by the programming may also be used.

In the case where the storage element is formed of a cell of EEPROM or FLASH type (third family) having its state conditioning the oscillation frequency of oscillator 1, the cell switches a resistive or capacitive element constitutive of a switchable network of element 4. An advantage of the use of an EEPROM cell is that its programming is not detectable by optical means in the circuit, with respect to the use of fusible elements. However, the programming of such a cell requires high-voltage programming elements with respect to the operation voltage.

According to a preferred embodiment, resistive element 42 and resistors 52 and 62 are formed of polysilicon elements, element 42 being programmable by irreversible decrease in its value (fourth family), or of elements using the chalcogenide-based technology (fifth family).

An advantage of these embodiments is that they do not require a high programming voltage and the programming is non-destructive of the resistive element, so that it cannot be observed. Considering the example of FIG. 2, capacitors 41, 51, and 61 are selected so that the frequency of oscillator 1 is included between the frequencies of oscillators 2 and 3 in the case of an unprogrammed resistor (of relatively high value) and that the frequency of oscillator 1 is greater than the frequency of the two other oscillators in the case of a programmed resistor (relatively low value). It will be ascertained that the dispersion of these elements is smaller than the variation between the resistance values in the blank state or in the programmed state. This condition poses no problem in practice since the dispersion between elements generally is on the order of 5% while it is easy to obtain a variation in the value of the polysilicon resistor on the order of 30%.

Of course, the present invention is likely to have various alterations, modifications, and improvements which will readily occur to those skilled in the art. In particular, the values to be given to the capacitances and resistances of the resistive and capacitive cells of the ring oscillators are within the abilities of those skilled in the art based on the functional indications given hereabove and according to the application.

Further, other circuits for exploiting the frequency values may be provided, provided to respect an operation assimilated to a digital operation avoiding voltage and current references.

Further, although the present invention has been described in relation with five examples of possible storage element families, it applies to any type of storage element provided that it is compatible with an assembly in a circuit where its state conditions the frequency of a signal. For example, the storage element may be based on a magnetic memory technology.

Finally, although the present invention has been described in relation with the storage of two levels (programmed or not), its transposition to a multiple-level memory is within the abilities of those skilled in the art by increasing the number of oscillators of predetermined frequencies with respect to which to compare the frequency of the oscillator conditioned by the state of the storage element.

The invention claimed is:

1. A method for reading the state of a non-volatile storage element comprising:
   conditioning a frequency of a first oscillator to a state of the storage element;
   comparing the frequency of the first oscillator with the predetermined frequency of a second oscillator, selected to be included between two possible frequency values of the first oscillator according to the state of the storage element; and
   comparing the frequency of the first oscillator with that of a third oscillator having a frequency smaller than that of the first oscillator in programming states of the storage element, and smaller than that of the second oscillator.

2. The method of claim 1, wherein the first oscillator triggers the reading of the state of the second one.

3. The method of claim 1, wherein the storage element is a resistive and capacitive circuit.

4. The method of claim 1, wherein the storage element comprises a resistor programmable by irreversible decrease in its value.

5. The method of claim 1, wherein the respective frequencies of the oscillators are conditioned by elements of same nature.

6. A circuit for reading the state of a non-volatile storage element comprising:
   a first oscillator having a frequency conditioned by the state of the storage element;
   at least one second oscillator having a predetermined frequency which is selected to be included between the frequencies of the first oscillator in two states of the storage element;
   a comparator of the respective frequencies of the first and second oscillators; and
   a third oscillator having a predetermined frequency which is selected to be smaller than the frequency of the first oscillator whatever the programming state of the storage element, and smaller than that of the second oscillator.

7. The circuit of claim 6, wherein the comparator comprises:
   one counter per oscillator, the respective clock inputs of the counters receiving the signals provided by the corresponding oscillators; and
   a logic circuit for analyzing counter overflow signals.

8. A storage element comprising:
   a first oscillating circuit producing a first oscillating output with a first frequency;
   a second oscillating circuit producing a second oscillating output with a second frequency; and
   a comparison circuit to determine a value stored in the storage element based on a comparison of the first frequency and the second frequency.

9. The storage element of claim 8, further comprising:
   a first circuit comprising at least one resistor and at least one capacitor,
   wherein the first oscillating circuit is coupled to the first circuit and wherein the first frequency is conditioned on a characteristic of the first circuit.

10. The storage element of claim 9, wherein the characteristic of the first circuit is a time constant of the first circuit.

11. The storage element of claim 9, wherein the characteristic of the first circuit is a resistance value of at least one resistor and/or a capacitance value of the at least one capacitor.

12. The storage element of claim 9, wherein the at least one resistor and/or the at least one capacitor of the first circuit is adjustable to set a storage value for the storage element.

13. The storage element of claim 12, wherein the first circuit further comprises at least one switch each coupled to one of the at least one resistor and/or the at least one capacitor, and
   wherein each of the at least one switch operates to couple the at least one resistor and/or the at least one capacitor to the first oscillating circuit to adjust the first frequency.

14. The storage element of claim 12, wherein the first circuit further comprises at least one fusible element each coupled to one of the at least one resistor and/or the at least one capacitor, and
   wherein each of the at least one fusible element is fusible to couple the at least one resistor and/or the at least one capacitor to the first oscillating circuit to adjust the first frequency.

15. The storage element of claim 12, wherein the first circuit further comprises at least one fusible element each coupled to one of the at least one resistor and/or the at least one capacitor, and
   wherein each of the at least one fusible element is fusible to decouple the at least one resistor and/or the at least one capacitor to the first oscillating circuit to adjust the first frequency.

16. The storage element of claim 12, wherein the at least one resistor and/or the at least one capacitor of the first circuit is adjustable to set a storage value for the storage element to a first state and to a second state by affecting a characteristic of the first circuit to be a first characteristic or a second characteristic, and
   wherein the second oscillating circuit is coupled to a second circuit having a circuit characteristic that is value between the first characteristic and the second characteristic.

17. The storage element of claim 12, wherein the first characteristic and the second characteristic are a first time constant and a second time constant for the first circuit, and the circuit characteristic of the second circuit is a time constant between the first time constant and the second time constant.

18. The storage element of claim 8, further comprising:
a first counter circuit coupled to the first oscillating circuit and adapted to generate a first value indicative of the first frequency; and
a second counter circuit coupled to the second oscillating circuit and adapted to generate a second value indicative of the second frequency,
wherein the comparison circuit is adapted to determine the value stored in the storage element based on a comparison of the first value and the second value.

19. The storage element of claim 18, wherein the first counter circuit is adapted to produce the first value as a first output signal when a first counter reaches an overflow state, and
wherein the second counter circuit is adapted to produce the second value as a second output signal when a second counter reaches the overflow state, and
wherein the comparison circuit is adapted to determine the value stored in the storage element based on a comparison of the first value and the second value by comparing times at which the first output signal and the second output signal are generated.

20. The storage element of claim 8, further comprising:
a third oscillating circuit producing a third oscillating output with a third frequency, and
wherein the comparison circuit is adapted to determine the value stored in the storage element based on a comparison of the first frequency to the second frequency and the third frequency.

21. The storage element of claim 20, further comprising:
a first counter circuit coupled to the first oscillating circuit and adapted to generate a first value indicative of the first frequency;
a second counter circuit coupled to the second oscillating circuit and adapted to generate a second value indicative of the second frequency; and
a third counter circuit coupled to the third oscillating circuit and adapted to generate a third value indicative of the third frequency;
wherein the comparison circuit is adapted to determine the value stored in the storage element based on a comparison of the first value to the second value and the third value.

22. The storage element of claim 8, wherein the storage element is a non-volatile storage element.

23. A method for reading the state of a storage element comprising:
generating, with a first oscillating circuit, a first oscillating signal having a first frequency;
generating, with a second oscillating circuit, a second oscillating signal having a second frequency; and
determining a value stored in the storage element based on a comparison of the first frequency and the second frequency.

24. The method of claim 23, further comprising:
maintaining a first count based on the first frequency; and
maintaining a second count based on the second frequency,
wherein determining the value based on the comparison of the first frequency and the second frequency comprises determining the value based on a comparison of the first count and the second count.

25. The method of claim 24, further comprising:
generating a first signal when a first counter maintaining the first count reaches an overflow state; and
generating a second signal when a second counter maintaining the second count reaches the overflow state,
wherein determining the value based on the comparison of the first count and the second count comprises determining the value based on a comparison of a first time at which the first signal is generated and a second time at which the second signal is generated.

26. The method of claim 23, further comprising:
generating, with a third oscillating circuit, a third oscillating signal having a third frequency; and
determining the value stored in the storage element based on a comparison of the first frequency to the second frequency and the third frequency.

27. The method of claim 26, further comprising:
maintaining a third count based on the third frequency,
wherein determining the value based on the comparison of the first frequency to the second frequency and the third frequency comprises determining the value based on a comparison of the first count to the second count and the third count.

28. A method of writing a value to a storage element, the storage element comprising a first circuit and an oscillating circuit producing an oscillating signal having a frequency based on a characteristic of the first circuit, the first circuit comprising at least one resistor and at least one capacitor, the method comprising:
changing a value of a first circuit so as to change the frequency of the oscillating signal; and
generating an output indicative of the value stored in the storage element based at least in part on a comparison of the frequency of the oscillating signal to a second frequency of a second oscillating signal.

29. The method of claim 28, further comprising:
prior to the act of changing, generating a different output indicative of the value stored in the storage element based at least in part on a comparison of the frequency of the oscillating signal to the second frequency of the second oscillating signal,
wherein the output and the different output are indicative of different states of the storage element.

30. The method of claim 28, wherein changing the value of the first circuit comprises changing a time constant of the first circuit.

31. The method of claim 28, wherein changing the value of the first circuit comprises:
adjusting at least one switch of the at least one circuit to couple or decouple one of the at least one resistor and the at least one capacitor to the oscillating circuit so as to change the frequency of the oscillating signal.

32. The method of claim 28, wherein changing the value of the first circuit comprises:
adjusting at least one fusible element of the at least one circuit to couple or decouple one of the at least one resistor and the at least one capacitor to the oscillating circuit so as to change the frequency of the oscillating signal.

33. A method of producing a storage element, the method comprising:
coupling an adjustable circuit to a first oscillating circuit, the first oscillating circuit being adapted to produce a first oscillating signal having a first frequency based on a value of the adjustable circuit, the adjustable circuit comprising at least one resistor and at least one capacitor and being adjustable to change the value;

coupling a static circuit to a second oscillating circuit, the second oscillating circuit being adapted to produce a second oscillating signal having a second frequency based on a value of the static circuit; and coupling an output terminal of the storage element to a comparison circuit adapted to generate an output indicative of a value stored in the storage element based on a comparison of the first frequency and the second frequency.

34. The method of claim 33, wherein coupling the output terminal of the storage element to the comparison circuit comprises direct coupling the output terminal to the comparison circuit.

35. The method of claim 33, wherein coupling the adjustable circuit to the first oscillating circuit comprises coupling each of the at least one resistor and the at least one capacitor to the first oscillating circuit via at least one switch adapted to connect and disconnect the at least one resistor and the at least one capacitor from the first oscillating circuit.

36. The method of claim 33, wherein coupling the adjustable circuit to the first oscillating circuit comprises coupling each of the at least one resistor and the at least one capacitor to the first oscillating circuit via at least one fusible element adapted to connect or disconnect the at least one resistor and the at least one capacitor from the first oscillating circuit.

* * * * *

UNITED STATES PATENT AND TRADEMARK OFFICE
CERTIFICATE OF CORRECTION

PATENT NO. : 7,813,216 B2
APPLICATION NO. : 11/662995
DATED : October 12, 2010
INVENTOR(S) : Sylvie Wuidart It is certified that error appears in the above-identified patent and that said Letters Patent is hereby corrected as shown below:

On the Title page Item (57) In the abstract, lines 2-3 should read:
element, including conditioning the frequency of a first oscil-
lator to the state of this element, and comparing the fre- Signed and Sealed this Thirtieth Day of November, 2010

David J. Kappos
*Director of the United States Patent and Trademark Office*